US006608869B1

(12) United States Patent
Limberg

(10) Patent No.: US 6,608,869 B1
(45) Date of Patent: Aug. 19, 2003

(54) DUAL-CARRIER HETERODYNE FOR SEPARATING ORTHOGONAL COMPONENTS OF COMPLEX AMPLITUDE-MODULATION SIGNALS

(75) Inventor: Allen Leroy Limberg, Vienna, VA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/578,483

(22) Filed: May 26, 2000

Related U.S. Application Data
(60) Provisional application No. 60/136,232, filed on May 26, 1999.

(51) Int. Cl.[7] .............................. H04L 23/02; H04L 5/12
(52) U.S. Cl. ..................... 375/261; 375/327; 375/326; 375/344; 455/209; 455/192.2
(58) Field of Search .................... 375/320, 321, 375/261, 376, 326, 327, 325, 344, 345; 455/164.1, 165.1, 173.1, 180.3, 182.2, 183.1, 190.1, 192.2, 207, 208, 209, 260

(56) References Cited

U.S. PATENT DOCUMENTS

| | | | | | |
|---|---|---|---|---|---|
| 4,476,585 A | * | 10/1984 | Reed | ........................... | 455/207 |
| 5,003,621 A | * | 3/1991 | Gailus | ......................... | 455/209 |
| 5,483,691 A | * | 1/1996 | Heck et al. | ............... | 455/234.2 |
| 5,805,241 A | * | 9/1998 | Limberg | ..................... | 348/725 |
| 5,857,004 A | * | 1/1999 | Abe | ............................ | 375/344 |
| 5,870,669 A | * | 2/1999 | Kawai | ......................... | 455/209 |
| 5,949,830 A | * | 9/1999 | Nakanishi | .................... | 375/334 |
| 6,385,266 B1 | * | 5/2002 | Haberle et al. | ............. | 375/376 |

* cited by examiner

Primary Examiner—Phuong Phu
(74) Attorney, Agent, or Firm—Sughrue Mion, PLLC

(57) ABSTRACT

A method for receiving a modulated carrier wave with asymmetrical upper and lower sidebands, which carrier wave may be suppressed, is described. A first down-converter in the receiver heterodynes the asymmetrical upper and lower sidebands of the modulated carrier wave being received with a first heterodyning signal, to generate a first down-conversion result superposed on the image thereof in a first final-intermediate-frequency signal offset from zero frequency. To do this, the first heterodyning signal essentially consists of two component frequencies, one below the lower sideband and the other above the upper sideband of the modulated carrier wave. A second down-converter in the receiver heterodynes the asymmetrical upper and lower sidebands of the modulated carrier wave being received with a second heterodyning signal that is the Hilbert transform of the first heterodyning signal. This is done to generate a second down-conversion result superposed on the image thereof in a second final-intermediate-frequency signal offset from zero frequency. The receiver further comprises a first demodulator for demodulating the first down-conversion result to recover an in-phase baseband signal and a second demodulator for demodulating the second down-conversion result to recover a quadrature-phase baseband signal.

32 Claims, 5 Drawing Sheets

DUAL-CARRIER HETERODYNE FOR SEPARATING ORTHOGONAL COMPONENTS OF COMPLEX AMPLITUDE-MODULATION SIGNALS

This application is filed under 35 U.S.C. 111(a) claiming pursuant to 35 U.S.C. 119(e)(1) benefit of the filing date of provisional application Ser. No. 60/136,232 filed May 26, 1999, pursuant to 35 U.S.C. 111(b).

The invention relates to the synchrodyning of the asymmetrical upper and lower sidebands of a modulated carrier wave, which carrier wave may be suppressed during transmission of its sidebands, to recover at baseband the in-phase and quadrature-phase components of a complex amplitude-modulating signal.

BACKGROUND OF THE INVENTION

A quadrature-amplitude-modulated (QAM) carrier wave is representative of this type of signal. A QAM carrier wave is frequently employed for the transmission of a symbol stream descriptive of digital information, with the modulating values at peak excursions of the in-phase and quadrature-phase carrier wave components defining a two-dimensional symbol constellation. A problem in superheterodyne radio receivers for QAM signals is preventing the slow rotation of this symbol constellation that arises from incorrect frequency and phase of the local oscillators employed for complex synchrodyning of the QAM signal to baseband. Improper orientation of the symbol constellation not only affects the amplitudes of the in-phase and quadrature-phase components of the baseband signal recovered by the complex synchrodyne, but also undesirably introduces cross-coupling between the components which are supposed to be separated each from the other by the complex synchrodyne. If the error in orientation of the symbol constellation is a static error, the cross-coupling response prior to data slicing can be reduced by using adaptive equalization filtering, either before or after demodulation is accomplished. To suppress the cross-coupling response effectively, the equalization filtering either has to be a complex filter or has to employ oversampling. Since the adaptation of equalizing filter parameters by data-dependent methods is done slowly over an extended period of time, dynamic errors in the orientation of the symbol constellation generally cannot be corrected for.

Errors in the size of the symbol constellation are more readily accommodated than errors in rotation. Errors in the size of the symbol constellation can be either by fast-acting automatic gain control or by "soft" data slicing procedures.

U. S. patent No. 3,101,448 issued Aug. 24, 1963 to J. P. Costas and titled "SYNCHRONOUS DETECTOR SYSTEM" describes an automatic-frequency-and-phase-control (AFPC) feedback loop for controlling the frequency and phase of the local oscillator used for synchrodyning a suppressed carrier amplitude-modulation (AM) signal to baseband. This type of feedback loop is referred to as "the Costas loop" by those skilled in the art of digital communications receiver design.

I have discerned that a signal with complex amplitude-modulation can be down-converted in frequency to generate a pair of orthogonal final intermediate-frequency signals, each with respective upper and lower sidebands symmetrical about a respective final intermediate-frequency carrier. That is, each of these orthogonal final I-F signals is a double-sideband amplitude-modulation signal. The carriers of these two orthogonal DSB AM signals have the same frequency and are in quadrature phasing respective to each other. Each DSB AM final I-F signal is obtained by heterodyning two carriers together with the signal having complex amplitude-modulation, so as to superpose the down-conversion result and its image. To do this, one heterodyning carrier is lower in frequency than the AM signal with complex amplitude-modulation that it is being heterodyned with and the other heterodyning carrier is higher in frequency than the AM signal with complex amplitude-modulation that it is being heterodyned with. I have also discerned that each of these two orthogonal DSB AM final-IF signals when phase-split and subjected to complex multiplication by a complex carrier of the same frequency as the final I-F signal generates real and imaginary components of a respective complex baseband product output signal. I have determined that the imaginary component of the complex baseband product output signal obtained from each of these two orthogonal DSB AM final-IF signals can be used as the error signal in an AFPC feedback loop for a local oscillator used in the plural-step synchrodyning of the AM signal with complex amplitude-modulation to baseband. I have found that as the imaginary term of the complex baseband product output signal is reduced to zero by the AFPC feedback loop, the real component of the complex baseband product output signal provides a demodulation result for one of the two orthogonal phases of the original AM signal with complex amplitude-modulation. This demodulation result is provided without accompanying demodulation result from the other of the two orthogonal phases of the original AM signal with complex amplitude-modulation.

I have determined that the imaginary components of the complex baseband product output signals obtained from the two orthogonal DSB AM final-IF signals can be combined for use as the error signal in an AFPC feedback loop for a local oscillator used in the plural-step synchrodyning of the AM signal with complex amplitude-modulation to baseband. I have found that the imaginary terms of the complex baseband product output signal can be simultaneously reduced to zero by the AFPC feedback loop. This causes the real components of the complex baseband product output signals to provide respective demodulation results for each of the two orthogonal phases of the original AM signal with complex amplitude-modulation, which respective demodulation results are orthogonal to each other. These orthogonal demodulation results are suitable for time-division multiplexing for equalization in dual-phase digital filtering, I have observed.

SUMMARY OF THE INVENTION

The invention is embodied in a receiver for asymmetrical upper and lower sidebands of a modulated carrier wave, which carrier wave may be suppressed. A first down-converter in the receiver heterodynes the asymmetrical upper and lower sidebands of the modulated carrier wave being received with a first heterodyning signal, to generate a first down-conversion result superposed on the image thereof in a first final-intermediate-frequency signal offset from zero frequency. To do this, the first heterodyning signal essentially consists of two component frequencies, one below the lower sideband and the other above the upper sideband of the modulated carrier wave.

A second down-converter in the receiver heterodynes the asymmetrical upper and lower sidebands of the modulated carrier wave being received with a second heterodyning signal that is the Hilbert transform of the first heterodyning signal. This is done to generate a second down-conversion result superposed on the image thereof in a second finalintermediate-frequency signal offset from zero frequency. The receiver further comprises a first demodulator for demodulating the first down-conversion result to recover an in-phase baseband signal and a second demodulator for demodulating the second down-conversion result to recover a quadrature-phase baseband signal.

DETAILED DESCRIPTION OF THE PREFERRED EMBODIMENTS

Figure 1:
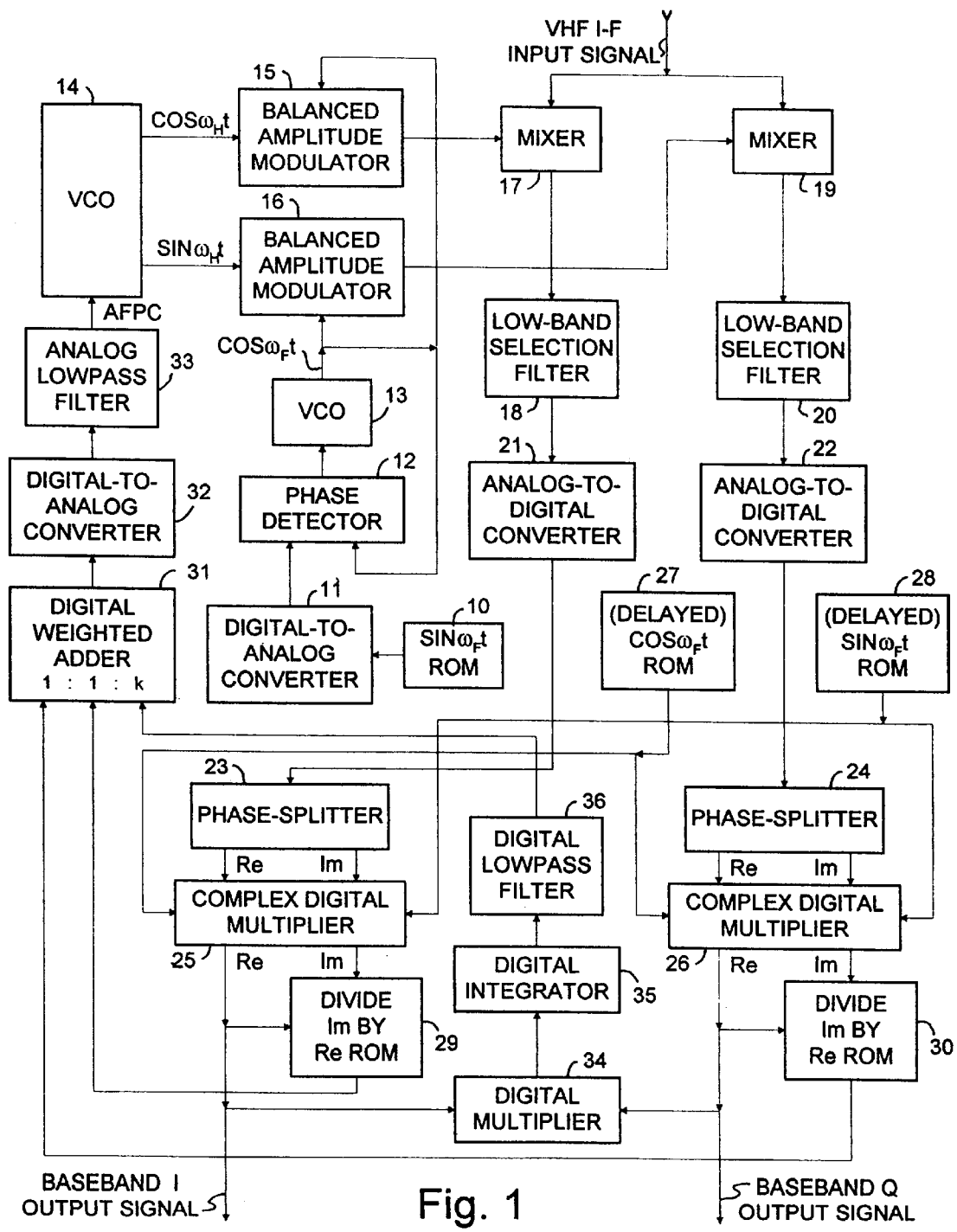
FIG. 1 is a block schematic diagram of down-conversion and complex synchronous demodulation circuitry, which circuitry in accordance with an aspect of the invention separates orthogonal components of a complex amplitude-modulation signal by using a dual-carrier heterodyning signal during down-conversion, and which circuitry in accordance with a further aspect of the invention derives tanlock AFPC signals for the down-conversion from the results of complex synchrodyning to baseband each of the separated orthogonal components of the complex amplitude-modulation signal.

FIG. 1 shows down-conversion circuitry which separates orthogonal components of a complex amplitude-modulation signal by using a dual-carrier heterodyne during down-conversion of those orthogonal components to a final intermediate-frequency band. The orthogonal components are then digitized, and complex synchronous demodulation of the digitized components is performed in the digital regime. By way of example, the complex amplitude-modulation signal is a QAM signal, although the apparatus and method described in more detail following are useful for processing multiple-phase-shift-keying (MPSK) signals including quadrature-phase-shift-keying (QPSK) signals.

After translation to the final intermediate-frequency band, the complex amplitude-modulation signal is to have a carrier frequency of $\omega_F$ radians per second. A read-only memory (ROM) 10 stores a look-up table of sin $\omega_F t$ values and supplies a stream of samples descriptive of this system function responsive to being addressed by a sample counter (not shown in FIG. 1). The digital samples descriptive of the sin $\omega_F t$ system function are supplied to a digital-to-analog converter 11 that responds with analog sin $\omega_F t$ signal supplied to a phase detector 12. The phase detector 12 compares this analog sin $\omega_F t$ signal with oscillations from a first voltage-controlled oscillator 13 to generate an automatic frequency and phase control signal for the VCO 13. This AFPC signal locks the first VCO 13 oscillations in quadrature phase with the analog sin $\omega_F t$ input signal supplied to the phase detector 12, so the VCO 13 supplies cos $\omega_F t$ oscillations. With reasonable care in the design of the VCO 13 there is very little harmonic distortion accompanying these cos $\omega_F t$ oscillations.

A second voltage-controlled oscillator (VCO) 14 supplies in-phase oscillations at a frequency of $\omega_H$ radians per second to a first balanced amplitude-modulator 15 and quadrature-phase oscillations at the frequency of $\omega_H$ radians per second to a second balanced amplitude-modulator 16. The balanced amplitude-modulator 15 modulates the cos $\omega_H t$ carrier supplied from the second VCO 14 by a cos $\omega_F t$ modulating signal supplied from the first voltage-controlled oscillator 13 to generate a first dual-heterodyning signal cos($\omega_H-\omega_F$)t+cos($\omega_H+\omega_F$)t. The balanced amplitude-modulator 16 modulates the sin $\omega_H t$ carrier supplied from the second VCO 14 by a cos $\omega_F t$ modulating signal supplied from the first voltage-controlled oscillator 13 to generate a second dual-heterodyning signal sin($\omega_H-\omega_F$)t+sin($\omega_H+\omega_F$)t, which is the Hilbert transform of the first dual-heterodyning signal cos($\omega_H-\omega_F$)t+Cos($\omega_H+\omega_F$)t.

A first mixer 17 mixes a very-high-frequency (VHF) complex amplitude-modulation signal supplied as a penultimate intermediate-frequency signal with the first dual-heterodyning signal to generate the input signal applied to a first analog low-band selection filter 18. A second mixer 19 mixes the VHF complex amplitude-modulation signal supplied as a penultimate intermediate-frequency signal with the second dual-heterodyning signal to generate the input signal applied to a second analog low-band selection filter 20. The first mixer 17 and the second mixer 19 are of a linear multiplicative type and are preferably identical in their construction. The first low-band selection filter 18 and the second low-band selection filter 20 also are preferably identical in their construction and are, by way of example, surface-acoustic-wave (SAW) filters. The low-band selection filters 18 and 20 select the low-band down-conversion results as their respective responses and suppress the high-band up-conversion results that are the images of the low-band down-conversion results. In some embodiments of the invention, such as those in which Nyquist-slope filtering is done in the VHF intermediate-frequency amplifier chain, the low-band selection filters 18 and 20 are lowpass filters that exhibit flat response through the low band. In alternative embodiments of the invention the low-band selection filters 18 and 20 are bandpass filters. In certain ones of these alternative embodiments the low-band selection filters 18 and 20 are bandpass filters that provide the Nyquist-slope filtering used to minimize intersymbol interference (ISI).

Analog-to-digital converters 21 and 22 digitize the responses of the low-band selection filters 18 and 20, respectively. The digitized final I-F responses from the ADC 21 and from the ADC 22 are supplied to phase-splitters 23 and 24, respectively, which respond with complex digital multiplicand input signals for complex digital multipliers 25 and 26, respectively. Read-only memories 27 and 28 are addressed by a sample counter (not shown in FIG. 1) and store look-up tables for cos $\omega_F t$ and sin $\omega_F t$ components of a complex digital carrier of frequency $\omega_F$ radians per second. These look-up tables of cos $\omega_F t$ and sin $\omega_F t$ components are delayed in time respective to the sin $\omega_F t$ look-up table stored in the ROM 10, the delay compensating for the latent delay in the down-conversion to final I-F frequency. The complex digital carrier read from the ROMs 27 and 28 is supplied as complex digital multiplier input signal to each of the complex digital multipliers 25 and 26. This conditions the complex digital multipliers 25 and 26 to synchronously detect their respective multiplicand input signals in a digital complex synchrodyning procedure.

The real component of the complex product output signal of the complex digital multiplier 25 is a digitized in-phase baseband output signal supplied to the remainder of the receiver; and the real component of the complex product output signal of the complex digital multiplier 26 is a digitized quadrature-phase baseband output signal supplied to the remainder of the receiver. The remainder of the receiver includes decision circuitry, which FIG. 1 does not show, for symbol decoding the digitized complex baseband output signal composed of these digitized in-phase and quadrature-phase baseband output signals. This decision circuitry is typically preceded by digital filtering, used for equalizing the digitized complex baseband output signal and for suppressing any echoes therein.

The VHF complex amplitude-modulation signal supplied to the mixers 17 and 19 has a suppressed carrier cos $\omega_V t$ of frequency $_{107}$ $_V$ radians per second and is composed of a number of lower-sideband and upper-sideband components. Each pair of lower-sideband and upper-sideband components has a respective value of $(a_M/2)\{\cos[(\omega_V-\omega_M)t-\phi_M]+\cos[(\omega_V+\omega_M)t+\phi_M]\}$, having been generated by an amplitude modulating frequency of respective frequency $\omega_M$ radians per second, respective amplitude $a_M$, and respective relative phase $\phi_M$.

The response $R_{18}$ of the first low-band selection filter 18 to each pair of lower-sideband and upper-sideband components has a respective value equal to the low-band component of the mixer 17 response $R_{17}=(a_M/2)\{\cos[(\omega_V-\omega_M)t-\phi_M]+\cos[(\omega_V+\omega_M)t+\phi_M]\}[\cos(\omega_H-\omega_F)t+\cos(\omega_H+\omega_F)t]$. Applying the trigonometric identity cos A cos B=(½) cos (A+B)+(½) cos(A−B), discarding the high-band components and collecting similar terms, one obtains $R_{18}=(a_M/4)\{\cos\,[(\omega_V-\omega_H+\omega_F-\omega_M)t-\phi_M]+\cos[(\omega_V-\omega_H-\omega_F-\omega_M)t-\phi_M]+\cos[(\omega_V-\omega_H+\omega_F+\omega_M)t+100\,_M]+\cos[(\omega_V-\omega_H-\omega_F+\omega_M)t+\phi_M]\}$. When the system is frequency and phase locked properly, $\omega_V=\omega_H$, which causes the condition in which $R_{18}=(a_M/2)\{\cos[(\omega_F-\omega_M)t-\phi_M]+\cos[(\omega_F+\omega_M)t+\phi_M]\}$. Complex synchronous demodulation of this signal component using $\omega_F$ carrier recovers a complex product signal from the complex digital multiplier 25, which complex product signal comprises a real baseband signal component of cos $(\omega_M t+\phi_M)$ and a zero-valued imaginary baseband signal component corresponding to each pair of lower-sideband and upper-sideband frequency components in the VHF penultimate I-F signal.

The response $R_{20}$ of the second low-band selection filter 20 to each pair of lower-sideband and upper-sideband components has a respective value equal to the low-band component of the mixer 20 response $R_{20}=(a_M/2)\{\cos[(\omega_V-\omega_M)t-\phi_M]+\cos[(\omega_V+\omega_M)t-\phi_M]\}[\sin(\omega_H+\omega_F)t+\sin(\omega_H-\omega_F)t]$. That is, $R_{20}=(a_M/4)\{\sin[(\omega_V-\omega_H+\omega_F-\omega_M)t-\phi_M]+\sin[(\omega_V-\omega_H-\omega_F-\omega_M)t-\phi_M]+\sin[(\omega_V-\omega_H+\omega_F+\omega_M)t+\phi_M]+\sin[(\omega_V-\omega_H-\omega_F+\omega_M)t+\phi_M]\}$, which is the Hilbert transform of $R_{18}$. When the system is frequency and phase locked properly, $\omega_V=\omega_H$, which causes the condition in which $R_{20}=(a_M/2)\{\sin[(\omega_F-\omega_M)t-\phi_M]+\sin[(\omega_F+\omega_M)t+\phi_M]\}$. Complex synchronous demodulation of this signal component using $\omega_F$ carrier recovers a complex product signal from the complex digital multiplier 26, which complex product signal comprises a real baseband signal component of $\sin(\omega_M t+\phi_M)$ and a zero-valued imaginary baseband signal component corresponding to each pair of lower-sideband and upper-sideband frequency components in the VHF penultimate I-F signal.

When the system is not frequency and phase locked, the imaginary baseband signal component $Im_{25}$ in the complex product signal from the complex digital multiplier 25 has a value $a_m\cos(\omega_M t+\phi_M)\sin(\omega_H-\omega_V)t$ summed over all values of M, and the imaginary baseband signal component $Im_{26}$ in the complex product signal from the complex digital multiplier 26 has a value $a_m\sin(\omega_M t+\phi_M)\sin(\omega_H-\omega_V)t$ summed over all values of M. When the system is not frequency and phase locked, the real baseband signal component $Re_{25}$ in the complex product signal from the complex digital multiplier 25 has a value $a_m\cos(\omega_M t+\phi_M)\cos(\omega_H-\omega_V)t$ summed over all values of M, and the real baseband signal component $Re_{26}$ in the complex product signal from the complex digital multiplier 26 has a value $a_m\sin(\omega_M t+\phi_M)\cos(\omega_H-\omega_V)t$ summed over all values of M.

The quotient $Im_{25}/Re_{25}$ has a value tan $(\omega_H-\omega_V)t$. The quotient $Im_{26}/Re_{26}$ also has a value tan $(\omega_H-\omega_V)t$. Generally considered, either of these terms is suitable for a type of AFPC loop known generically as a "tanlock" AFPC loop. However, when $\cos(\omega_M t+\phi_M)t$ summed over all values of M approaches zero, the digital quotient $Im_{25}/Re_{25}$ becomes difficult to determine accurately because of the quantization error introduced by limitation on bit resolution of the $Im_{25}$ and $Re_{25}$ terms. And when $\sin(\omega_M t+\phi_M)t$ summed over all values of M approaches zero, the digital quotient $Im_{26}/Re_{26}$ becomes difficult to determine accurately because of the quantization error introduced by limitation on bit resolution of the $Im_{26}$ and $Re_{26}$ terms. Fortunately, $\cos(\omega_M t+\phi_M)t$ and $\sin(\omega_M t+\phi_M)t$ terms summed over all values of M do not simultaneously approach zero.

The AM signals with complex amplitude-modulation associated with digital communications usually have sideband energy under all modulation conditions. This is the case with QAM, for example.

FIG. 1 shows a read-only memory 29, which is addressed by $Im_{25}$ and $Re_{25}$ terms of the complex product signal from the complex digital multiplier 25. FIG. 1 also shows a read-only memory 30 addressed by $Im_{26}$ and $Re_{26}$ terms of the complex product signal from the complex digital multiplier 26. The ROM 29 stores a look-up table of quotient $Im_{25}/Re_{25}$ values and generates a $\tan(\omega_H-\omega_V)t$ output signal so long as the $Im_{25}$ and $Re_{25}$ terms are within suitable digital ranges. The ROM 30 stores a look-up table of quotient $Im_{26}/Re_{26}$ values and generates a $\tan(\omega_H-\omega_V)t$ output signal so long as the $Im_{26}$ and $Re_{26}$ terms are within suitable digital ranges. The $\tan(\omega_H-\omega_V)t$ output signals from the ROMs 29 and 30 are summed in 1:1 ratio in a digital weighted adder 31. The digital sum output signal from the adder 31 is supplied to a digital-to-analog converter 32 for conversion to an analog $\tan(\omega_H-\omega_V)t$ signal applied to an analog lowpass filter 33 as input signal thereto. The response of the filter 33 is applied to the VCO 14 as its automatic frequency and phase control (AFPC) signal.

The $Im_{25}$ and $Re_{25}$ terms not being within suitable digital ranges is accommodated as follows, if desired. The existence or non-existence of such condition is detected to generate an additional address bit for the ROM 30 and a read-enable signal for the ROM 29. Reading from the ROM 29 is enabled when and only when this additional address bit for the ROM 30 indicates the $Im_{25}$ and $Re_{25}$ terms are both within suitable digital ranges, and the ROM 30 is conditioned by this additional address bit to supply quotient $Im_{26}/Re_{26}$ values as its read output signal to the digital weighted adder 31. When and only when the additional address bit for the ROM 30 indicates the $Im_{25}$ and $Re_{25}$ terms are not both within suitable digital ranges, the ROM 29 is not enabled for reading, and the ROM 30 is conditioned by this additional address bit to supply twice quotient $Im_{26}/Re_{26}$ values as its read output signal to the digital weighted adder 31. When the ROM 29 is not enabled for reading, it supplies arithmetic zero as its read output signal to the adder 31.

The $Im_{26}$ and $Re_{26}$ terms not being within suitable digital ranges can be accommodated similarly. The existence or non-existence of such condition is detected to generate an additional address bit for the ROM 29 and a read-enable signal for the ROM 30. Reading from the ROM 30 is enabled when and only when this additional address bit for the ROM 29 indicates the $Im_{26}$ and $Re_{26}$ terms are both within suitable digital ranges, and the ROM 29 is conditioned by this additional address bit to supply quotient $Im_{25}/Re_{25}$ values as its read output signal to the digital weighted adder 31. When and only when the additional address bit for the ROM 290 indicates the $Im_{26}$ and $Re_{26}$ terms are not both within suitable digital ranges, the ROM 30 is not enabled for reading, and the ROM 29 is conditioned by this additional address bit to supply twice quotient $Im_{25}/Re_{25}$ values as its read output signal to the digital weighted adder 31. When the ROM is not enabled for reading, it supplies arithmetic zero as its read output signal to the adder 31.

When frequency lock is achieved, so $\omega_H$ and $\omega_V$ are the same in frequency and close in phase, there will be a static or quasi-static phase error term in the AFPC loop as thusfar described, since the loop is a zero-order loop. As known generally in servomechanism design, a first-order AFPC loop containing a true integrator can eliminate static phase error in the output signal from the servomechanism. The static phase error term in the AFPC loop for the VCO 14 as thusfar described arises when the $Im_{25}$ and $Im_{26}$ terms from the complex digital multipliers 25 and 26, respectively, both are so small as to be rounded down to zero most of the time. This poses problems with designing accumulators for introducing the true integrator into the AFPC loop thusfar described while not overfilling during pull-in to frequency lock.

Phase lock of the VCO 14 oscillations with the carrier frequency of the VHF I-F signal is better achieved proceeding from the larger $Re_{25}$ and $Re_{26}$ terms from the complex digital multipliers 25 and 26, rather than from the $Im_{25}$ and $Im_{26}$ terms that are so small as to be rounded down to zero most of the time. The phase-locking portion of the AFPC signal for the VCO 14 can be developed by an auxiliary automatic phase control (APC) loop parallel to the AFPC loop used for frequency locking. FIG. 1 shows a digital multiplier 34 multiplying the $Re_{25}$ and $Re_{26}$ terms from the complex digital multipliers 25 and 26 to generate a product signal for integration by a digital integrator 35. The integrated product signal from the digital integrator 35 is smoothed by a lowpass digital filter 36, which can be of infinite-impulse-response (IIR) type to reduce the hardware associated with an alternative lowpass digital filter of finite-impulse-response (FIR) type. The automatic phase control (APC) signal provided as the filter 36 response is supplied as a further summand input signal to the digital weighted adder 31. The digital weighted adder 31 sums in 1:1:k ratio the output signal of ROM 29, the output signal of ROM 30 and the filter 36 response, to generate a digital unfiltered AFPC error signal. The digital integrator 35 is a digital accumulator the contents of which average close to zero in the lowpass digital filter 36 response as long as the $Re_{25}$ and $Re_{26}$ terms exhibit no long term correlation. Presumably, the data transmission system is designed so orthogonal components of the radio-frequency carrier modulation exhibit no long-term correlation. The overall time constant that the digital integrator 35 and the lowpass digital filter 36 introduce into the APC loop containing them is sufficiently long as not to interfere with the operation of the AFPC loop containing the ROMs 29 and 30. The first-order APC loop will adjust the phase of VCO 14 oscillations so that the $Re_{25}$ and $Re_{26}$ terms are responsive to the orthogonal components of the VHF I-F carrier modulation, in order to minimize the long term correlation of these $Re_{25}$ and $Re_{26}$ terms.

Figure 2:
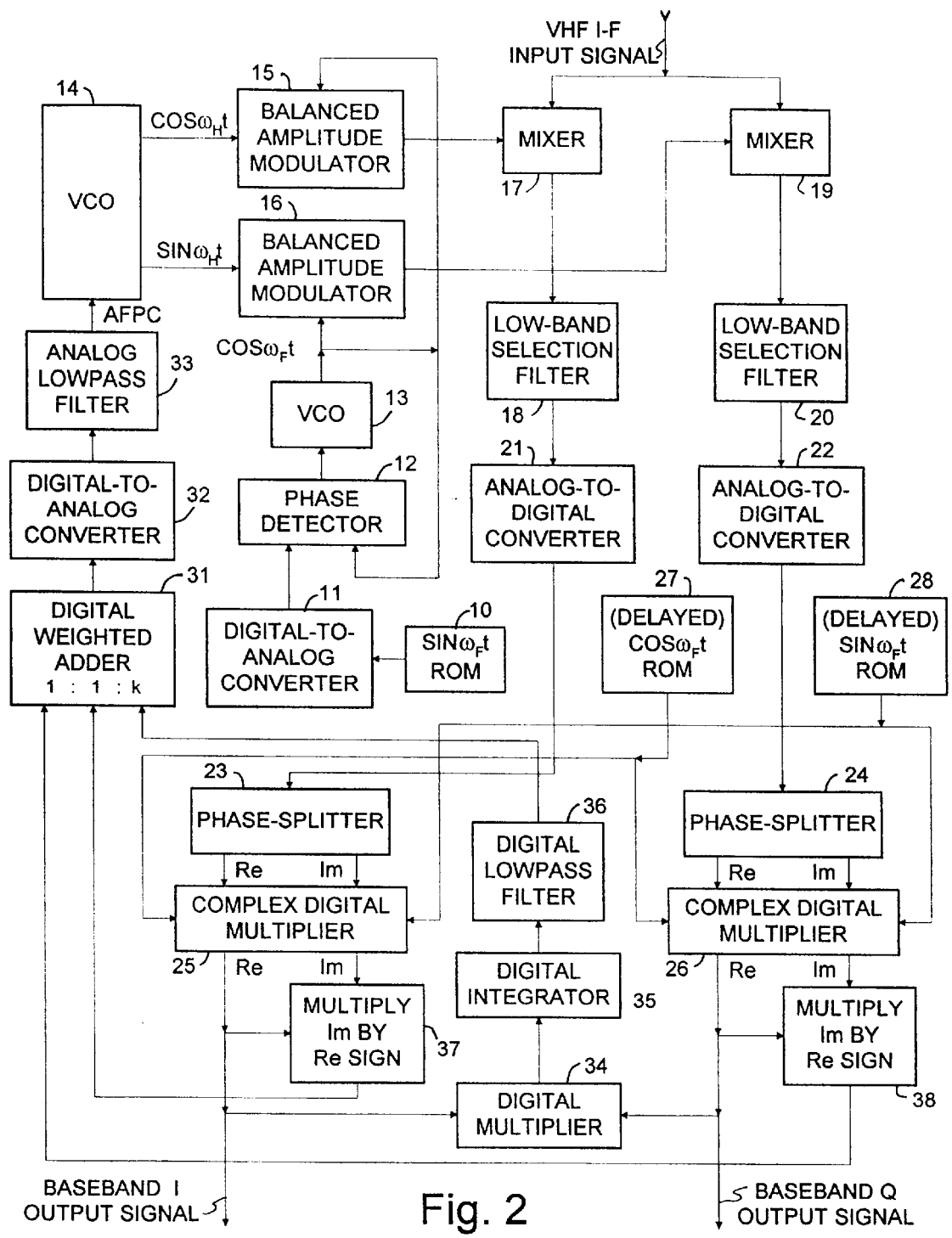
FIG. 2 is a block schematic diagram of a modification of the FIG. 1 down-conversion and complex synchronous demodulation circuitry, the FIG. 1 circuitry being modified with regard to how AFPC signals for the down-conversion from the results of complex synchrodyning to baseband each of the separated orthogonal components of the complex amplitude-modulation signal.

FIG. 2 shows an embodiment of the invention alternative to that shown in FIG. 1, which embodiment does not require the read-only memories 29 and 30. A quantity B that is sometimes positive and sometimes negative can be described as the product of a unity-amplitude sense-of-polarity term sgn[B] and an absolute-value amplitude term abs[B]. FIG. 2 replaces the ROM 29 with apparatus 37 for multiplying the imaginary baseband signal component $Im_{25}$ in the complex product signal from the complex digital multiplier 25 by sgn[$Re_{25}$], $Re_{25}$ being the real baseband signal component in the complex product signal from the complex digital multiplier 25. In effect, sgn[$Re_{25}$] is an amplitude-limiter response to the real baseband signal component $Re_{25}$. FIG. 2 replaces the ROM 30 with apparatus 38 for multiplying the imaginary baseband signal component $Im_{26}$ in the complex product signal from the complex digital multiplier 26 by sgn[$Re_{26}$], $Re_{26}$ being the real baseband signal component in the complex product signal from the complex digital multiplier 26. In effect, sgn[$Re_{26}$] is an amplitude-limiter response to the real baseband signal component $Re_{26}$.

In a conventional structure for selectively complementing a variable the samples of which are expressed in two's complement numbers the apparatus 37 comprises a selective bit complementor followed by a digital adder adding the sign bit to the selective bit complementor output signal. The apparatus 38 is similar in structure to the apparatus 37.

Rather than the error signal in the zero-order AFPC loop for the VCO 14 being $\tan(\omega_H-\omega_V)t$ in form, as in a tanlock loop, it could be $\sin(\omega_H-\omega_V)t$ as in the original Costas loop. For small arguments the signals are substantially the same.

When the system is not frequency and phase locked, the real baseband signal component $Re_{25}$ in the complex product signal from the complex digital multiplier 25 has a value $a_m\cos(\omega_M t+\phi_M) \cos(\omega_H-\omega_V)t$ summed over all values of M, and the imaginary baseband signal component $Im_{25}$ in the complex product signal from the complex digital multiplier 25 has a value $a_m\cos(\omega_M t+\phi_M) \sin(\omega_H-\omega_V)t$ summed over all values of M. The apparatus 37 multiplies $Im_{25}$ by sgn[$Re_{25}$], the polarity of $Re_{25}$. The sign of $Im_{25}$ polarity due to the $a_m\cos(\omega_M t+\phi_M)$ term is unaffected by such multiplication, it being the same in $Re_{25}$ and $Im_{25}$. The sign of $Im_{25}$ polarity due to the $\sin(\omega_H-\omega_V)$t term is changed in the second and third quadrants of $(\omega_H-\omega_V)$ cycle by the $\cos(\omega_H-\omega_V)$t term in $Re_{25}$ being negative in those second and third quadrants, rather than positive as in the first and fourth quadrants of the $(\omega_H-\omega_V)$ cycle. $Im_{25}$*sgn[$Re_{25}$] has the same amplitude as $Im_{25}$, but its sign over the $(\omega_H-\omega_V)$ cycle is that of $\tan(\omega_H-\omega_V)$t, rather than that of $\sin(\omega_H-\omega_V)$t. This is a valid error term for the APFC loop.

When the system is not frequency and phase locked, the real baseband signal component $Re_{26}$ in the complex product signal from the complex digital multiplier 26 has a value $a_m \sin(\omega_M t+\phi_M) \cos(\omega_H-\omega_V)$t summed over all values of M, and the imaginary baseband signal component $Im_{26}$ in the complex product signal from the complex digital multiplier 26 has a value $a_m \sin(\omega_M t+\phi_M) \sin(\omega_H-\omega_V)$t summed over all values of M. The apparatus 38 multiplies $Im_{26}$ by sgn[$Re_{26}$], the polarity of $Re_{26}$. The sign of $Im_{26}$ polarity due to the $a_m \sin(\omega_M t+\phi_M)$ term is unaffected by such multiplication, it being the same in $Re_{25}$ and $Im_{25}$. The sign of $Im_{26}$ polarity due to the $\sin(\omega_H-\omega_V)$t term is changed in the second and third quadrants of $(\omega_H-\omega_V)$ cycle by the $\cos(\omega_H-\omega_V)$t term in $Re_{26}$ being negative in those second and third quadrants, rather than positive as in the first and fourth quadrants of the $(\omega_H-\omega_V)$ cycle. $Im_{26}$*sgn[$Re_{26}$] has the same amplitude as $Im_{26}$, but its sign over the $(\omega_H-\omega_V)$ cycle is that of $\tan(\omega_H-\omega_V)$t, rather than that of $\sin(\omega_H-\omega_V)$t, and is a valid error term for the APFC loop.

{$Im_{26}$*sgn[$Re_{25}$]}+{$Im_{26}$*sgn[$Re_{26}$]} is substantially more uniform in amplitude than either of its component terms $Im_{26}$*sgn[$Re_{25}$] and $Im_{26}$*sgn[$Re_{26}$]. Interestingly, the absolute amplitude of this sum exhibits scalloped variation that has minima when the AFPC loop is best in phase lock and that has maxima when the AFPC loop is furthest from phase lock.

Figure 3:
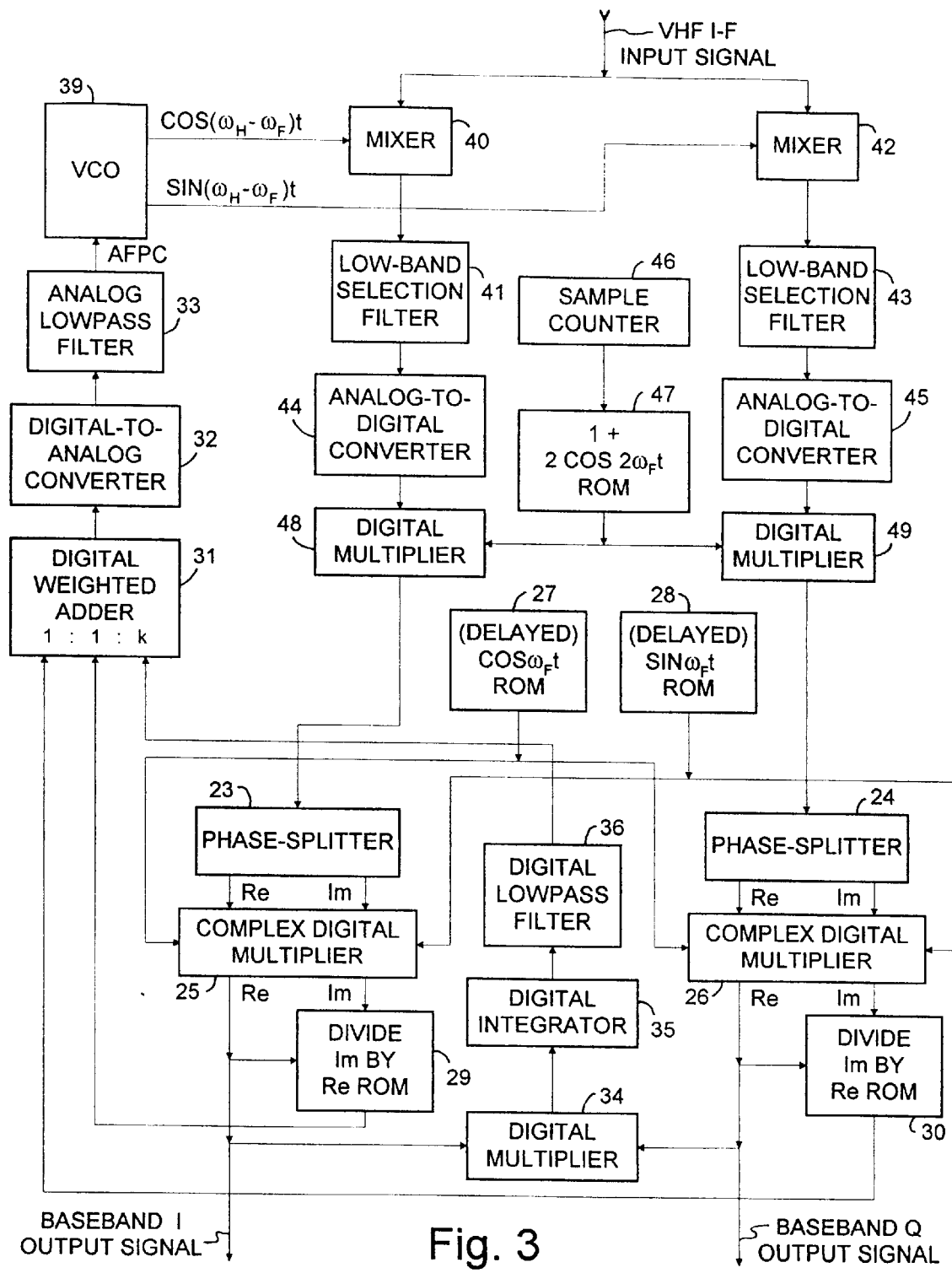
FIG. 3 is a block schematic diagram of down-conversion and complex synchronous demodulation circuitry, which circuitry in accordance with an aspect of the invention separates orthogonal components of a complex amplitude-modulation signal by generating double-sideband amplitude-modulation signals from the vestigial-sideband down-conversion results, and which circuitry in accordance with a further aspect of the invention derives tanlock AFPC signals for the down-conversion from the results of complex synchrodyning to baseband each of the separated orthogonal components of the complex amplitude-modulation signal.
Figure 4:
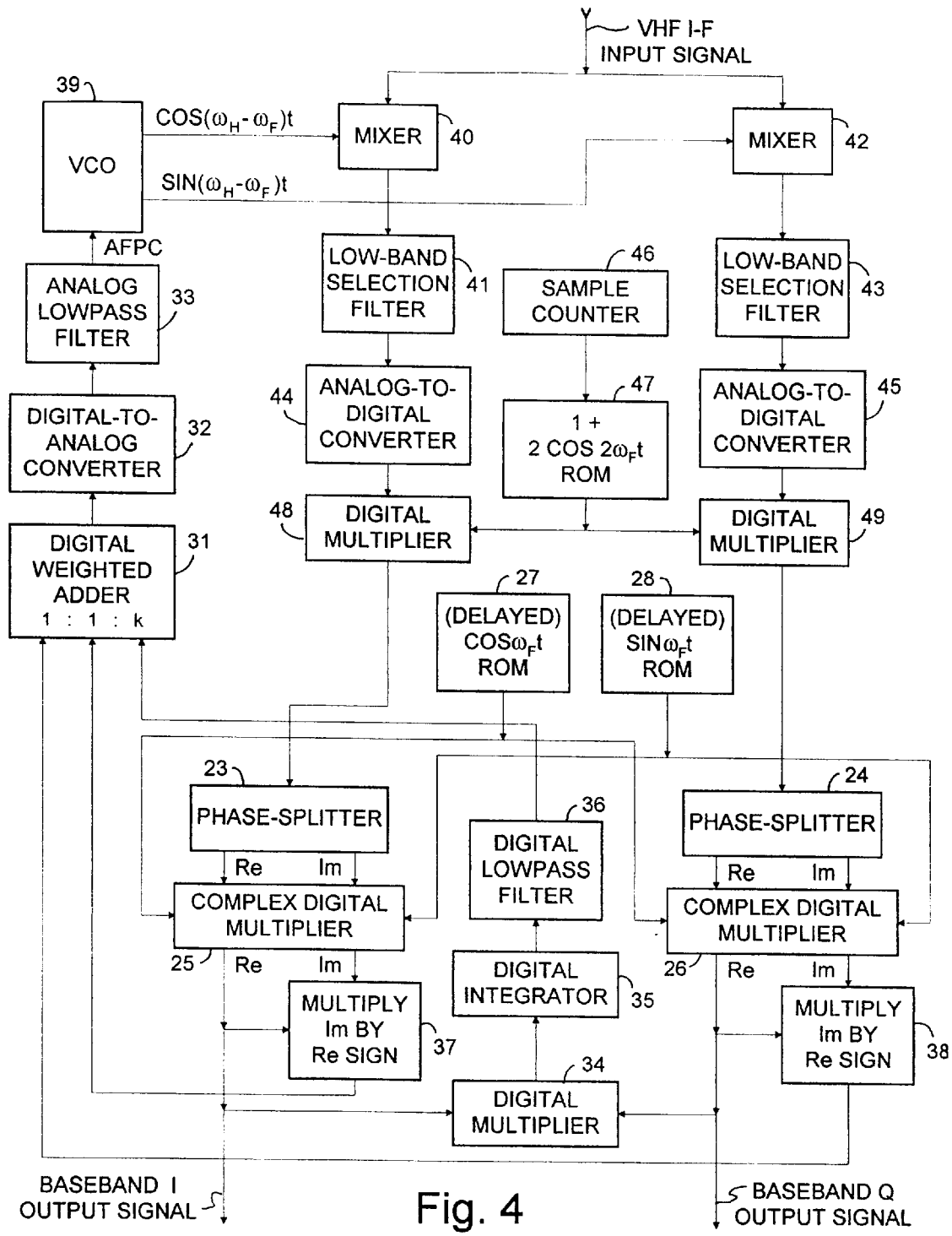
FIG. 4 is a block schematic diagram of a modification of the FIG. 3 down-conversion and complex synchronous demodulation circuitry, the FIG. 3 circuitry being modified with regard to how AFPC signals for the down-conversion from the results of complex synchrodyning to baseband each of the separated orthogonal components of the complex amplitude-modulation signal.

FIGS. 3 and 4 show variants of the down-conversion and complex synchronous demodulation circuitry of FIGS. 1 and 2 which replace the elements 10–22 with other circuitry. This other circuitry down-converts the vestigial-sideband VHF I-F signal is to a complex low-band VSB signal, digitizes that low-band VSB signal and then converts the low-band VSB signal to digitized double-sideband amplitude-modulation signal in the digital regime. A voltage-controlled oscillator (VCO) 39 generates complex oscillations at a frequency of $(\omega_H-\omega_F)$ radians per second.

A first mixer 40 mixes a very-high-frequency (VHF) complex amplitude-modulation signal supplied as a penultimate intermediate-frequency signal with the first dual-heterodyning signal to generate the input signal applied to a first analog low-band selection filter 41. A second mixer 42 mixes the VHF complex amplitude-modulation signal supplied as a penultimate intermediate-frequency signal with the second dual-heterodyning signal to generate the input signal applied to a second analog low-band selection filter 43. The first mixer 40 and the second mixer 42 are of a multiplicative type and are preferably identical in their construction. The first low-band selection filter 41 and the second low-band selection filter 43 also are preferably identical in their construction and are, by way of example, SAW filters. The filters 41 and 43 select the low-band down-conversion results as their respective responses and suppress the high-band up-conversion results that are the images of the low-band down-conversion results. These low-band down-conversion results have a nominal carrier frequency of $\omega_F$ radians per second, with the low-band selection filter 43 response being the Hilbert transform of the low-band selection filter 41 response. The responses of the low-band selection filters 41 and 43 are digitized by the analog-to-digital converters 44 and 45, respectively. A sample counter 46 cyclically addresses a read-only memory 47 to generate a digitized 1+2 cos $2\omega_F$t signal as ROM 47 read-out. A digital multiplier 48 multiplies the digitized low-band selection filter 41 response from the ADC 44 by this digitized 1+2 cos $2\omega_F$t signal to generate the phase-splitter 23 input signal. A digital multiplier 49 multiplies the digitized low-band selection filter 43 response from the ADC 45 by this digitized 1+2 cos $2\omega_F$t signal to generate the phase-splitter 24 input signal.

The VHF complex amplitude-modulation signal supplied to the mixers 40 and 42 has a suppressed carrier cos $\omega_V$t of frequency $\omega_V$ radians per second and is composed of a number of lower-sideband and upper-sideband components. Each pair of lower-sideband and upper-sideband components has a respective value of $(a_M/2)\{\cos[(\omega_V-\omega_M)t-\phi_M]+\cos[(\omega_V+\omega_M)t+\phi_M]\}$, having been generated by an amplitude modulating frequency of respective frequency $\omega_M$ radians per second, respective amplitude $a_M$, and respective relative phase $\phi_M$. The response $R_{41}$ of the first low-band selection filter 41 to each pair of lower-sideband and upper-sideband components has a respective value equal to the low-band component of the mixer 40 response $R_{40}$=[cos$(\omega_H-\omega_F)$t] $(a_M/2)\{\cos[(\omega_V-\omega_M)t-\phi_M]+\cos[(\omega_V+\omega_M)t+\phi_M]\}$. The response $R_{43}$ of the second low-band selection filter 43 to each pair of lower-sideband and upper-sideband components has a respective value equal to the low-band component of the mixer 42 response $R_{42}$=[sin$(\omega_H-\omega_F)$t] $(a_M/2)\{\cos[(\omega_V-\omega_M)t-\phi_M]+\cos[(\omega_V+\omega_M)t-\phi_M]\}$.

The digital multiplier 48 multiplies each $R_{41}$ component of the digitized response of the first low-band selection filter 41 by the digitized 1+2 cos $2\omega_F$t signal to generate in response to each pair of lower-sideband and upper-sideband components a respective $R_{48}$ component of a digital product output signal supplied from the multiplier 48 to the phase-splitter 23.

$$R_{48} = (1 + 2\cos 2\omega_F t)R_{41}$$

$$= (1 + 2\cos 2\omega_F t)\cos(\omega_H - \omega_F)t\{\cos[(\omega_V - \omega_M)t - \varphi_M] + \cos[(\omega_V + \omega_M)t - \varphi_M]\}$$

$$= [(1 + 2\cos 2\omega_F t)\cos(\omega_H - \omega_F)t](a_M/2)\{\cos[(\omega_V - \omega_M)t - \varphi_M] + \cos[(\omega_V + \omega_M)t - \varphi_M]\}$$

$$= [\cos(\omega_H - \omega_F)t + \cos(\omega_H + \omega_F)t](a_M/2)\{\cos[(\omega_V - \omega_M)t - \varphi_M] + \cos[(\omega_V + \omega_M)t - \varphi_M] +$$

$$[\cos(\omega_H - 3\omega_F)t](a_M/2)\{\cos[(\omega_V - \omega_M)t - \varphi_M] + \cos[(\omega_V + \omega_M)t - \varphi_M]\}.$$

The [cos$(\omega_H-\omega_F)$t+cos $(\omega_H+\omega_F)$t] $(a_M/2)\{\cos[(\omega_V-\omega_M)t-\phi_M]+\cos[(\omega_V+\omega_M)t-\phi_M]$ component of $R_{48}$ corresponds to $R_{18}$, the response of the first low-band selection filter 18 in the FIG. 1 down-conversion and complex synchronous demodulation circuitry, as digitized by the ADC 21. The [cos $(\omega_H-3\omega_F)$t] $(a_M/2)\{\cos[(\omega_V-\omega_M)t-\phi_M]+\cos[(\omega_V+\omega_M)t-\phi_M]\}$ component of $R_{48}$ is at frequencies higher than demodulation process for recovering baseband signal. Low-pass filtering used after demodulation for defining the bandwidth of the baseband signal will suppress the higher-order spectrum of the demodulation results that the synchrodyning procedure generates in response to these [cos $(\omega_H-3\omega_F)$t] $(a_M/2)\{\cos[(\omega_V-\omega_M)t-100_M]+\cos[(\omega_V+\omega_M)t-\phi_M]\}$ components.

The digital multiplier 49 multiplies each $R_{43}$ component of the digitized response of the second low-band selection filter 43 by the digitized 1+2 cos $2\omega_F t$ signal to generate in response to each pair of lower-sideband and upper-sideband components a respective $R_{49}$ component of a digital product output signal supplied from the multiplier 49 to the phase-splitter 24.

$$R_{49} = (1 + 2\cos 2\omega_F t)R_{43}$$

$$= (1 + 2\cos 2\omega_F t)\sin(\omega_H - \omega_F)t\{\cos[(\omega_V - \omega_M)t - \varphi_M] +$$

$$\cos[(\omega_V + \omega_M)t + \varphi_M]\}$$

$$= [(1 + 2\cos 2\omega_F t)\sin(\omega_H - \omega_F)t](a_M/2)\{\cos[(\omega_V - \omega_M)t - \varphi_M] +$$

$$\cos[(\omega_V + \omega_M)t - \varphi_M]\}$$

$$= [\sin(\omega_H - \omega_F)t + \sin(\omega_H + \omega_F)t](a_M/2)\{\cos[(\omega_V - \omega_M)t - \varphi_M] +$$

$$\cos[(\omega_V + \omega_M)t - \varphi_M] +$$

$$[\sin(\omega_H - 3\omega_F)t](a_M/2)\{\cos[(\omega_V - \omega_M)t - \varphi_M] +$$

$$\cos[(\omega_V + \omega_M)t - \varphi_M]\}.$$

The $[\sin(\omega_H-\omega_F)t+\sin(\omega_H+\omega_F)t]$ $(a_M/2)\{\cos[(\omega_V-\omega_M)t-\phi_M]+\cos[(\omega_V+\omega_M)t-\phi_M]$ component of $R_{49}$ corresponds to $R_{20}$, the response of the second low-band selection filter 20 in the FIG. 1 down-conversion and complex synchronous demodulation circuitry, as digitized by the ADC 22. The $[\sin(\omega_H-3\omega_F)t]$ $(a_M/2)\{\cos[(\omega_V-\omega_M)t-\phi_M]+\cos[(\omega_V+\omega_M)t-\phi_M]\}$ component of $R_{49}$ is at frequencies higher than those of concern in the demodulation process for recovering baseband signal. Lowpass filtering used after demodulation for defining the bandwidth of the baseband signal will suppress the higher-order spectrum of the demodulation results that the synchrodyning procedure generates in response to these $[\sin(\omega_H-3\omega_F)t]$ $(a_M/2)\{\cos[(\omega_V-\omega_M)t-\phi_M]+\cos[(\omega_V+\omega_M)t-\phi_M]\}$ components.

FIG. 4 shows an embodiment of the invention alternative to that shown in FIG. 3, which embodiment does not include the read-only memories 29 and 30. FIG. 4 replaces the ROM 29 with the apparatus 37 for multiplying the imaginary baseband signal component $Im_{25}$ in the complex product signal from the complex digital multiplier 25 by sgn[$Re_{25}$], $Re_{25}$ being the real baseband signal component in the complex product signal from the complex digital multiplier 25. FIG. 4 replaces the ROM 30 with the apparatus 38 for multiplying the imaginary baseband signal component $Im_{26}$ in the complex product signal from the complex digital multiplier 26 by sgn[$Re_{26}$], $Re_{26}$ being the real baseband signal component in the complex product signal from the complex digital multiplier 26.

Figure 5:
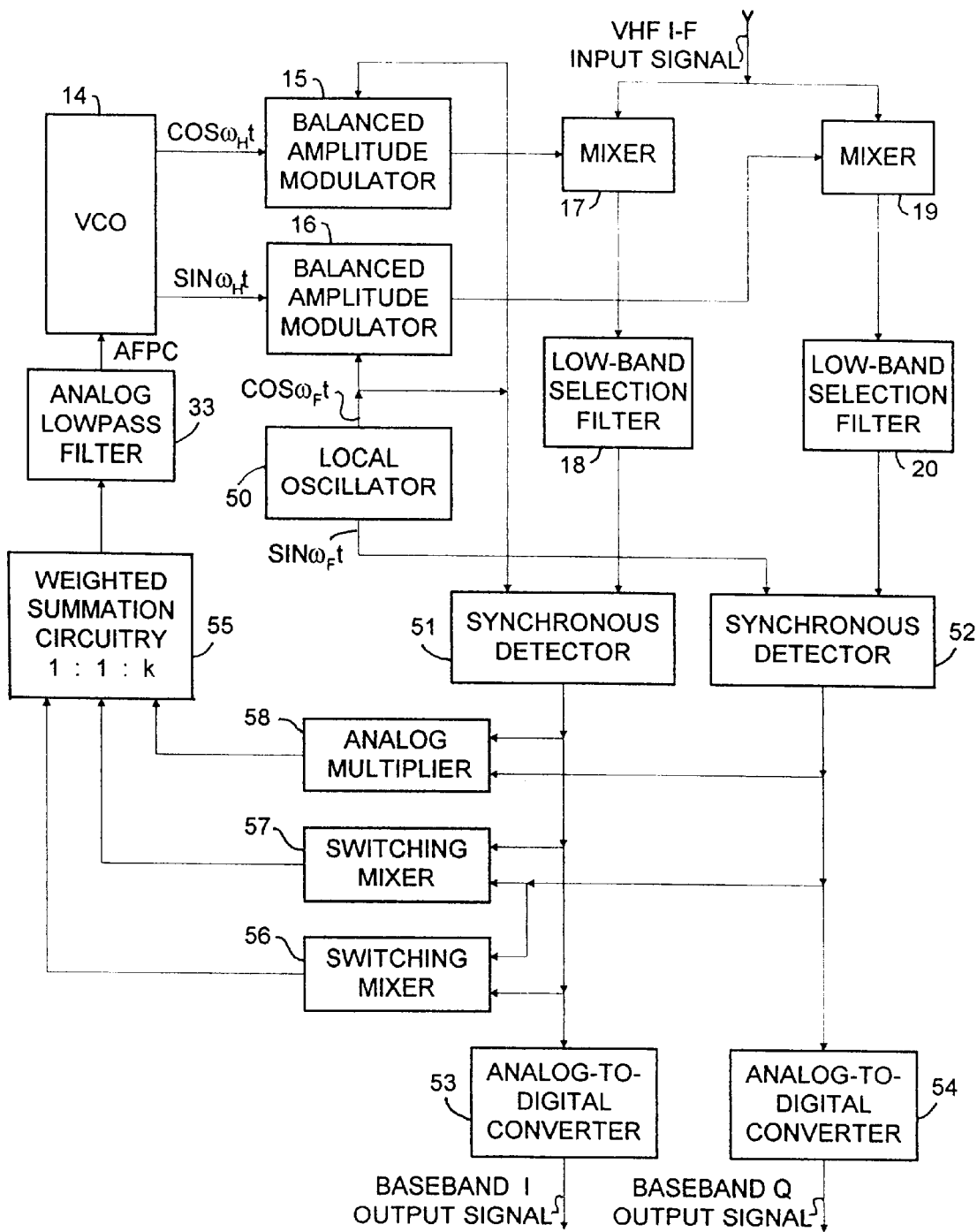
FIG. 5 is a block schematic diagram of down-conversion and complex synchronous demodulation circuitry alternative to those of FIGS. 1 and 2, which FIG. 5 circuitry in accordance with an aspect of the invention separates orthogonal components of a complex amplitude-modulation signal by using a dual-carrier heterodyning signal during down-conversion, and which circuitry in accordance with a further aspect of the invention derives tanlock AFPC signals for the down-conversion from the results of complex synchrodyning to baseband each of the separated orthogonal components of the complex amplitude-modulation signal.

FIG. 5 shows down-conversion and complex synchronous demodulation circuitry alternative to that in FIGS. 1 and 2. In FIG. 5 the complex synchronous demodulation circuitry is of a type operating in the analog regime, and analog-to-digital conversion succeeds demodulation rather than preceding it. Local oscillator circuitry 50 generates in-phase cos $\omega_F t$ analog oscillations and quadrature-phase sin $\omega_F t$ analog oscillations. In FIG. 5, as in FIGS. 1 and 2, the VCO 14 supplies in-phase oscillations at a frequency of $\omega_H$ radians per second to the first balanced amplitude-modulator 15 and quadrature-phase oscillations at the frequency of $\omega_H$ radians per second to the second balanced amplitude-modulator 16. The balanced amplitude-modulator 15 modulates the cos $\omega_H t$ carrier supplied from the VCO 14 by a cos $\omega_F t$ modulating signal supplied from the local oscillator circuitry 50 to generate a first dual-heterodyning signal $\cos(\omega_H-\omega_F)t+\cos(\omega_H+\omega_F)t$. The balanced amplitude-modulator 16 modulates the sin $\omega_H t$ carrier supplied from the second VCO 14 by a cos $\omega_F t$ modulating signal supplied from the local oscillator circuitry 50 to generate a second dual-heterodyning signal $\sin(\omega_H-\omega_F)t+\sin(\omega_H+\omega_F)t$, which is the Hilbert transform of the first dual-heterodyning signal $\cos(\omega_H-\omega_F)t+\cos(\omega_H+\omega_F)t$. In FIG. 5, as in FIGS. 1 and 2, the first mixer 17 mixes the VHF complex amplitude-modulation signal supplied as a penultimate intermediate-frequency signal with the first dual-heterodyning signal to generate the input signal applied to the first analog low-band selection filter 18. In FIG. 5, as in FIGS. 1 and 2, the second mixer 19 mixes the VHF complex amplitude-modulation signal supplied as a penultimate intermediate-frequency signal with the second dual-heterodyning signal to generate the input signal applied to a second analog low-band selection filter 20.

In FIG. 5 a synchronous detector 51 synchrodynes the final intermediate-frequency response of the first analog low-band selection filter 18 to baseband by synchronously detecting that response in accordance with the cos $\omega_F t$ modulating signal supplied from the local oscillator circuitry 50. A synchronous detector 52 synchrodynes the final intermediate-frequency response of the second analog low-band selection filter 20 to baseband by synchronously detecting that response in accordance with the sin $\omega_F t$ modulating signal supplied from the local oscillator circuitry 50. Analog-to-digital converters 53 and 54 digitize the in-phase baseband signal from the synchronous detector 51 and the quadrature-phase baseband signal from the synchronous detector 52, respectively, for application to the remainder of the receiver.

In FIG. 5 a weighted adder 55 supplies the input signal of the analog lowpass filter 33, the response of which filter 33 is supplied to the VCO 14 as AFPC signal. A first input signal for the weighted adder 55 is the output signal from a switching mixer 57 which multiplies the in-phase baseband signal from the synchronous detector 51 by a square wave resulting from symmetrically limiting the quadrature-phase baseband signal from the synchronous detector 52. A second input signal for the weighted adder 55 is the output signal from a switching mixer 58 which multiplies the quadrature-phase baseband signal from the synchronous detector 52 by a square wave resulting from symmetrically limiting the in-phase baseband signal from the synchronous detector 51. A third input signal for the weighted adder 55 is the product output signal from a four-quadrant analog multiplier 56 receiving the in-phase baseband signal from the synchronous detector 51 and the quadrature-phase baseband signal from the synchronous detector 52 as multiplicand and multiplier input signals. The first, second and third input signals are weighted in 1:1:k ratio in the weighted summation the weighted adder 55 performs to generate the output signal that the weighted adder 55 supplies as the input signal for the analog lowpass filter 33.

What is claimed is:

1. A method for separately recovering in a radio receiver first and second components of the modulating signal used to generate a complex-amplitude-modulation signal transmitted to and received by said radio receiver, said first and second components of said modulating signal being mutually orthogonal to each other, said method comprising the steps of:

converting the complex-amplitude-modulation signal received by said radio receiver to a penultimate intermediate-frequency signal and amplifying the power in said penultimate intermediate-frequency signal compared to the complex-amplitude-modulation signal received by said radio receiver;

generating a first pair of equal-amplitude heterodyning signals separated in frequency by twice the carrier frequency of a first final intermediate-frequency signal;

heterodyning said penultimate intermediate-frequency signal with said first pair of equal-amplitude heterodyning signals to generate said first final intermediate-frequency signal;

synchrodyning said first final intermediate-frequency signal to recover, as a real first baseband signal, said first of the orthogonal components of said modulating signal;

generating a second pair of equal-amplitude heterodyning signals separated in frequency by twice the carrier frequency of a final intermediate-frequency signal, which said second pair of equal-amplitude heterodyning signals are in quadrature phasing with said first pair of equal-amplitude heterodyning signals of like frequencies;

heterodyning said penultimate intermediate-frequency signal with said second pair of equal-amplitude heterodyning signals to generate a second final intermediate-frequency signal; and synchrodyning said second final intermediate-frequency signal to recover, as a real second baseband signal, said second of the orthogonal components of said modulating signal.

2. The method of claim 1, wherein said step of generating the first pair of equal-amplitude heterodyning signals and said step of generating the second pair of equal-amplitude heterodyning signals are implemented by steps of:

generating a carrier-offset signal at the carrier frequency of said first final intermediate-frequency signal;

generating complex oscillations including an in-phase oscillation component and a quadrature-phase oscillation component;

modulating said in-phase oscillation component in accordance with said carrier-offset signal in a first balanced-amplitude-modulation procedure, which first balanced-amplitude-modulation procedure generates said first pair of equal-amplitude heterodyning signals; and modulating said quadrature-phase oscillation component in accordance with said carrier-offset signal in a second balanced-amplitude-modulation procedure, which second balanced-amplitude-modulation procedure generates said second pair of equal-amplitude heterodyning signals.

3. The method of claim 2, comprising the further steps of:

controlling the frequency and phase of said complex oscillations in response to an automatic-frequency-and-phase-control signal;

synchrodyning said first final intermediate-frequency signal to recover an imaginary third baseband signal; and deriving said automatic-frequency-and-phase-control signal at least in part from said first and third baseband signals.

4. The method of claim 3, comprising the further steps of:

synchrodyning said second final intermediate-frequency signal to recover an imaginary fourth baseband signal; and deriving said automatic-frequency-and-phase-control signal in further part from said second and fourth baseband signals.

5. The method of claim 4, comprising the further steps of:

multiplying said first and second baseband signals together to generate a product signal; and deriving said automatic-frequency-and-phase-control signal in still further part from said product signal.

6. The method of claim 3, comprising the further steps of:

multiplying said first and second real baseband signals together to generate a product signal; and deriving said automatic-frequency-and-phase-control signal in further part from said product signal.

7. The method of claim 2, comprising the further steps of:

controlling the frequency and phase of said complex oscillations in response to an automatic-frequency-and-phase-control signal;

synchrodyning said first final intermediate-frequency signal to recover an imaginary third baseband signal; and deriving said automatic-frequency-and-phase-control signal at least in part from said imaginary third baseband signal as multiplied by limiter response to said first baseband signal.

8. The method of claim 7, comprising the further steps of:

synchrodyning said second final intermediate-frequency signal to recover an imaginary fourth baseband signal; and deriving said automatic-frequency-and-phase-control signal in further part from said imaginary fourth baseband signal signal as multiplied by limiter response to said second baseband signal.

9. The method of claim 8, comprising the further steps of:

multiplying said first and second real baseband signals together to generate a product signal; and deriving said automatic-frequency-and-phase-control signal in still further part from said product signal.

10. The method of claim 7, comprising the further steps of:

multiplying said first and second real baseband signals together to generate a product signal; and deriving said automatic-frequency-and-phase-control signal in still further part from said product signal.

11. A method for separately recovering in a radio receiver first and second components of the modulating signal used to generate a complex-amplitude-modulation signal transmitted to and received by said radio receiver, said first and second components of said modulating signal being mutually orthogonal to each other, said method comprising the steps of:

converting the complex-amplitude-modulation signal received by said radio receiver to a penultimate intermediate-frequency signal and amplifying the power in said penultimate intermediate-frequency signal compared to the complex-amplitude-modulation signal received by said radio receiver;

generating complex oscillations including an in-phase oscillation component and a quadrature-phase oscillation component;

heterodyning said penultimate intermediate-frequency signal both with said in-phase oscillation component and with said quadrature-phase oscillation component to generate orthogonal components of a first final intermediate-frequency signal;

multiplying said orthogonal components of said first final intermediate-frequency signal each by a factor composed of a constant term and a second harmonic of the carrier frequency of said first final intermediate-frequency signal, to generate orthogonal components of a second final intermediate-frequency signal;

synchrodyning a first of the orthogonal components of said second final intermediate-frequency signal to recover, as a real first baseband signal, said first of the orthogonal components of said modulating signal; and synchrodyning a second of the orthogonal components of said second final intermediate-frequency signal to recover, as a real second baseband signal, said second of the orthogonal components of said modulating signal.

12. The method of claim 11, comprising the further steps of:

controlling the frequency and phase of said complex oscillations in response to an automatic-frequency-and-phase-control signal;

synchrodyning said first of the orthogonal components of said second final intermediate-frequency signal to recover an imaginary third baseband signal; and deriving said automatic-frequency-and-phase-control signal at least in part from said first and third baseband signals.

13. The method of claim 12, comprising the further steps of:

synchrodyning said second of the orthogonal components of said second final intermediate-frequency signal to recover an imaginary fourth baseband signal; and deriving said automatic-frequency-and-phase-control signal in further part from said second and fourth baseband signals.

14. The method of claim 13, comprising the further steps of:

multiplying said first and second baseband signals together to generate a product signal; and deriving said automatic-frequency-and-phase-control signal in still further part from said product signal.

15. The method of claim 12, comprising the further steps of:

multiplying said first and second real baseband signals together to generate a product signal; and deriving said automatic-frequency-and-phase-control signal in further part from said product signal.

16. The method of claim 11, comprising the further steps of:

controlling the frequency and phase of said complex oscillations in response to an automatic-frequency-and-phase-control signal;

synchrodyning said first orthogonal component of said second final intermediate-frequency signal to recover an imaginary third baseband signal; and deriving said automatic-frequency-and-phase-control signal at least in part from said imaginary third baseband signal as multiplied by limiter response to said first baseband signal.

17. The method of claim 16, comprising the further steps of:

synchrodyning said second of the orthogonal components of said second final intermediate-frequency signal to recover an imaginary fourth baseband signal; and deriving said automatic-frequency-and-phase-control signal in further part from said imaginary fourth baseband signal signal as multiplied by limiter response to said second baseband signal.

18. The method of claim 17, comprising the further steps of:

multiplying said first and second real baseband signals together to generate a product signal; and deriving said automatic-frequency-and-phase-control signal in still further part from said product signal.

19. The method of claim 16, comprising the further steps of:

multiplying said first and second real baseband signals together to generate a product signal; and deriving said automatic-frequency-and-phase-control signal in still further part from said product signal.

20. Apparatus for inclusion within a radio receiver after front-end circuitry for receiving a complex-amplitude-modulation signal as transmitted by a transmitter to said radio receiver, converting said complex-amplitude-modulation signal to a penultimate intermediate-frequency signal, and amplifying the power in said penultimate intermediate-frequency signal compared to the complex-amplitude-modulation signal received by said radio receiver; said apparatus comprising:

signal generation circuitry for generating a first pair of equal-amplitude heterodyning signals separated in frequency by twice the carrier frequency of a first final intermediate-frequency signal and for generating a second pair of equal-amplitude heterodyning signals separated in frequency by twice the carrier frequency of said final intermediate-frequency signal, which said second pair of equal-amplitude heterodyning signals are in quadrature phasing with said first pair of equal-amplitude heterodyning signals of like frequencies;

a first mixer for heterodyning said penultimate intermediate-frequency signal with said first pair of equal-amplitude heterodyning signals to generate said first final intermediate-frequency signal;

a second mixer for heterodyning said penultimate intermediate-frequency signal with said second pair of equal-amplitude heterodyning signals to generate a second final intermediate-frequency signal;

first synchronous detection circuitry for synchrodyning said first final intermediate-frequency signal to recover, as a real first baseband signal, a first component of modulating signal used in said transmitter for generating said complex-amplitude-modulation signal; and second synchronous detection circuitry for synchrodyning said second final intermediate-frequency signal to recover, as a real second baseband signal, a second component of said modulating signal used in said transmitter for generating said complex-amplitude-modulation signal, said first and second components of said modulating signal being mutually orthogonal to each other.

21. The apparatus of claim 20, wherein said signal generation circuitry for generating said first and second pairs of equal-amplitude heterodyning signals comprises:

controlled oscillator circuitry for generating oscillations supplied in first and second phases that are adjustable in response to a control signal, but are in a prescribed quadrature relationship respective to each other;

a first balanced amplitude modulator for modulating said oscillations supplied in said first phase by the carrier frequency of said first final intermediate-frequency signal thereby to generate said first pair of equal-amplitude heterodyning signals; and a second balanced amplitude modulator for modulating said oscillations supplied in said second phase by the carrier frequency of said first final intermediate-frequency signal thereby to generate said second pair of equal-amplitude heterodyning signals.

22. The apparatus of claim 21, wherein said first synchronous detection circuitry for synchrodyning said first final intermediate-frequency signal is of a type to recover an imaginary third baseband signal in addition to said real first baseband signal, and wherein said second synchronous detection circuitry for synchrodyning said second final intermediate-frequency signal is of a type to recover an imaginary fourth baseband signal in addition to said real second baseband signal.

23. The apparatus of claim 22, further comprising:
addition circuitry connected to supply a sum output signal responsive to at least first and second summand input signals;
first division circuitry for dividing said imaginary third baseband signal by said real first baseband signal to generate a first quotient signal, which is applied to said addition circuitry as said first summand input signal;
second division circuitry for dividing said imaginary fourth baseband signal by said real second baseband signal to generate a second quotient signal, which is applied to said addition circuitry as said second summand input signal; and lowpass filter circuitry connected for responding to said sum output signal with a response applied to said controlled oscillator circuitry as its said control signal, for adjusting the first and second phases of the oscillations said controlled oscillator circuitry respectively supplies to said first balanced amplitude modulator and to said second balanced amplitude modulator, thereby closing loops that employ said first and second quotient signals as tanlock signals.

24. The apparatus of claim 23, further comprising:
multiplier circuitry connected for multiplying said real first baseband signal by said real second baseband signal to generate a product signal; and
integrator circuitry connected for integrating said product signal to generate an integration result and for applying said integration result to said addition circuitry as a third summand input signal.

25. The apparatus of claim 22, further comprising:
addition circuitry connected to supply a sum output signal responsive to at least first and second summand input signals;
first multiplier circuitry for multiplying said real first baseband signal by amplitude-limiter response to said imaginary third baseband signal to generate a first product signal, which is applied to said addition circuitry as said first summand input signal;
second multiplier circuitry for multiplying said real second baseband signal by amplitude-limiter response to said imaginary fourth baseband signal to generate a second product signal, which is applied to said addition circuitry as said second summand input signal; and
lowpass filter circuitry connected for responding to said sum output signal with a response applied to said controlled oscillator circuitry as its said control signal, for adjusting the first and second phases of the oscillations said controlled oscillator circuitry respectively supplies to said first balanced amplitude modulator and to said second balanced amplitude modulator.

26. The apparatus of claim 25, further comprising:
third multiplier circuitry connected for multiplying said real first baseband signal by said real second baseband signal to generate a third product signal; and
integrator circuitry connected for integrating said third product signal to generate an integration result and for applying said integration result to said addition circuitry as a third summand input signal.

27. Apparatus for inclusion within a radio receiver after front-end circuitry for receiving a complex-amplitude-modulation signal as transmitted by a transmitter to said radio receiver, converting said complex-amplitude-modulation signal to a penultimate intermediate-frequency signal, and amplifying the power in said penultimate intermediate-frequency signal compared to the complex-amplitude-modulation signal received by said radio receiver; said apparatus comprising:
controlled oscillator circuitry for generating oscillations supplied in first and second phases that are adjustable in response to a control signal, but are in a prescribed quadrature relationship respective to each other;
a first mixer for heterodyning said penultimate intermediate-frequency signal with said oscillations supplied in said first phase by said controlled oscillator circuitry, thereby to generate a first final intermediate-frequency signal;
a second mixer for heterodyning said penultimate intermediate-frequency signal with said oscillations supplied in said second phase by said controlled oscillator circuitry, thereby to generate a second final intermediate-frequency signal;
circuitry for multiplying said first and said second final intermediate-frequency signals each by a factor composed of a constant term and a second harmonic of the carrier frequency of said first final intermediate-frequency signal, to generate a third final intermediate-frequency signal as the product of said first final intermediate-frequency signal multiplied by said factor, and, to generate a fourth final intermediate-frequency signal as the product of said second final intermediate-frequency signal multiplied by said factor;
first synchronous detection circuitry for synchrodyning said third final intermediate-frequency signal to recover, as a real first baseband signal, a first component of modulating signal used in said transmitter for generating said complex-amplitude-modulation signal; and
second synchronous detection circuitry for synchrodyning said fourth final intermediate-frequency signal to recover, as a real second baseband signal, a second component of said modulating signal used in said transmitter for generating said complex-amplitude-modulation signal, said first and second components of said modulating signal being mutually orthogonal to each other.

28. The apparatus of claim 27, wherein said first synchronous detection circuitry for synchrodyning said third final intermediate-frequency signal is of a type to recover an imaginary third baseband signal in addition to said real first baseband signal, and wherein said second synchronous detection circuitry for synchrodyning said fourth final intermediate-frequency signal is of a type to recover an imaginary fourth baseband signal in addition to said real second baseband signal.

29. The apparatus of claim 28, further comprising:
addition circuitry connected to supply a sum output signal responsive to at least first and second summand input signals;
first division circuitry for dividing said imaginary third baseband signal by said real first baseband signal to generate a first quotient signal, which is applied to said addition circuitry as said first summand input signal;
second division circuitry for dividing said imaginary fourth baseband signal by said real second baseband signal to generate a second quotient signal, which is applied to said addition circuitry as said second summand input signal; and lowpass filter circuitry connected for responding to said output signal with a response applied to said controlled oscillator circuitry as its said control signal, for adjusting the first an second phases of the oscillations and controlled oscillator circuitry respectively supplies to said first balanced amplitude modulator and to said second balanced amplitude modulator, thereby closing loops that employ said first and second quotient signals as tanlock signal.

30. The apparatus of claim 29, further comprising:

multiplier circuitry connected for multiplying said real first baseband signal by said real second baseband signal to generate a product signal; and integrator circuitry connected for integrating said product signal to generate an integration result and for applying said integration result to said addition circuitry as a third summand input signal.

31. The apparatus of claim 28, further comprising:

addition circuitry connected to supply a sum output signal responsive to at least first and second summand input signals;

first multiplier circuitry for multiplying said real first baseband signal by amplitude-limiter response to said imaginary third baseband signal to generate a first product signal, which is applied to said addition circuitry a said first summand input signal;

second multiplier circuitry for multiplying said real second baseband signal by amplitude-limiter response to said imaginary fourth baseband signal to generate a second product signal, which is applied to said addition circuitry as said second summand input signal; and lowpass filter circuitry connected for responding to said sum output signal with a response applied to said controlled oscillator circuitry as its said control signal, for adjusting the first and second phases of the oscillations said controlled oscillator circuitry respectively supplies to said first balanced amplitude modulator and to said second balanced amplitude modulator.

32. The apparatus of claim 31, further comprising:

third multiplier circuitry connected for multiplying said real first baseband signal by said real second baseband signal to generate a third product signal; and integrator circuitry connected for integrating said third product signal to generate an integration result and for applying said integration result to said addition circuitry as a third summand input signal.

\* \* \* \* \*